(12) United States Patent
Pezeshki et al.

(10) Patent No.: US 12,034,096 B2
(45) Date of Patent: Jul. 9, 2024

(54) ENHANCED MICROLEDS FOR INTER-CHIP COMMUNICATIONS

(71) Applicant: AvicenaTech Corp., Sunnyvale, CA (US)

(72) Inventors: Bardia Pezeshki, Mountain View, CA (US); Robert Kalman, Mountain View, CA (US); Alexander Tselikov, Mountain View, CA (US); Cameron Danesh, Mountain View, CA (US)

(73) Assignee: AvicenaTech Corp., Sunnyvale, CA (US)

( * ) Notice: Subject to any disclaimer, the term of this patent is extended or adjusted under 35 U.S.C. 154(b) by 0 days.

(21) Appl. No.: 17/392,942

(22) Filed: Aug. 3, 2021

(65) Prior Publication Data

US 2022/0045234 A1 Feb. 10, 2022

Related U.S. Application Data

(60) Provisional application No. 63/060,944, filed on Aug. 4, 2020.

(51) Int. Cl.
*H04B 10/00* (2013.01)
*H01L 33/00* (2010.01)
*H01L 33/06* (2010.01)
*H01L 33/58* (2010.01)
*H04B 10/50* (2013.01)

(52) U.S. Cl.
CPC ............ *H01L 33/007* (2013.01); *H01L 33/06* (2013.01); *H01L 33/58* (2013.01); *H04B 10/502* (2013.01)

(58) Field of Classification Search
CPC . H04B 10/112; H04B 10/1123; H04B 10/114; H04B 10/1143; H04B 10/1149; H04B 10/116; H04B 10/40; H04B 10/502; H01L 33/007; H01L 33/06; H01L 33/58; H01L 33/04; H01L 33/32
USPC ....... 398/118, 119, 128, 130, 172, 135, 136, 398/158, 159, 164, 137, 138, 139, 182, 398/183, 186, 79; 385/24, 124, 129
See application file for complete search history.

(56) References Cited

U.S. PATENT DOCUMENTS

| 7,961,990 B2* | 6/2011 | Krishnamoorthy .......................... H01L 25/0657 398/139 |
| 10,002,928 B1 | 6/2018 | Raring et al. |
| 10,121,936 B2* | 11/2018 | Tangring ................. H01L 33/06 |
| 10,840,408 B1* | 11/2020 | Yin ......................... H01L 33/06 |

(Continued)

FOREIGN PATENT DOCUMENTS

| CN | 102130221 A | 7/2011 |
| CN | 106159047 A | 11/2016 |
| CN | 110190083 A | 8/2019 |

OTHER PUBLICATIONS

International Search Report on related PCT Application No. PCT/US2021/044357 from International Searching Authority (KIPO) dated Nov. 16, 2021.

(Continued)

*Primary Examiner* — Hanh Phan (57) ABSTRACT

An LED may be optimized for high speed operation for optical communication systems in a variety of ways. The LED, which may be a microLED, may include dopants and dopant levels allowing for increased speed of operation, the LED may include interlayers, and the LED may include other features.

8 Claims, 11 Drawing Sheets

(56) References Cited

U.S. PATENT DOCUMENTS

| | | | |
|---|---|---|---|
| 2012/0235116 A1* | 9/2012 | Su | H01L 33/06 |
| | | | 117/88 |
| 2015/0243648 A1 | 8/2015 | Edwards et al. | |
| 2019/0072720 A1 | 3/2019 | Heanue et al. | |
| 2019/0189603 A1 | 6/2019 | Wang et al. | |
| 2021/0126164 A1* | 4/2021 | Broell | H01L 33/0008 |
| 2022/0181517 A1* | 6/2022 | Pezeshki | H04B 10/615 |
| 2022/0392740 A1* | 12/2022 | Maeda | H01J 37/28 |

OTHER PUBLICATIONS

Written Opinion on related PCT Application No. PCT/US2021/044357 from International Searching Authority (KIPO) dated Nov. 16, 2021.

Carlos Medina et al., LED Based Visible Light Communication: Technology, Applications and Challenges—A Survey, International Journal of Advances in Engineering & Technology, vol. 8, Issue 4, pp. 482-495, Aug. 31, 2015, [retrieved on Feb. 23, 2020], Retrieved from <Researchgate, https://www.researchgate.net/publication/281408421> <doi:10.7323/ijaet/v8_iss4>.

Emmanouil Kioupakis et al., Interplay of Polarization Fields and Auger Recombination in the Efficiency Droop of Nitride Light-Emitting Diodes, Applied Physics Letters 101, 231107, Nov. 14, 2012.

U.S. Appl. No. 62/927,452, filed Oct. 29, 2019. (relevant passage: throughout and paragraph [0023]).

* cited by examiner

| Parameter | Disadvantages | Advantages | Standard microLED design | Design for high speed |
|---|---|---|---|---|
| Diameter (make small) | If the microLED is too small, Surface recombination around the edge can reduce quantum efficiency | Higher carrier density means faster speed at a given current. Edge effects will speed up the LED at the price of efficiency. | 10 um | 1um (0.3um – 2um) |
| # of QWs (reduce number) | At high temperature a single QW might lead to carrier overflow – not all the carriers get trapped in the QW and efficiency is reduced | Fewer QWs means more carriers per QW, which in turn means higher speed | 5 | 1 (1-3) |
| Wavelength (as set by indium content) (make short) | Too small indium content and you get carrier overflow and poor performance at high temperature | Smaller indium is lower piezoelectric field, which means greater overlap and faster speed. Also reduced Auger recombination | 430nm-650nm | 400nm (380nm-450nm) |
| Quantum well width (make small) | Poor confinement leading to carrier overflow at high temperature | Greater overlap between electrons and holes, faster recombination time. | 5nm | 2nm (1nm-3nm) |
| Doping in QWs (increase level) | High doping in the QWs increases non-radiative recombination. Also increases capacitance. | Increases speed of the LED by reducing the recombination time | undoped | ≥ 1x17/cm^3 (10^17-10^19) |

Fig. 10

ENHANCED MICROLEDS FOR INTER-CHIP COMMUNICATIONS

CROSS-REFERENCE TO RELATED APPLICATIONS

This application claims the benefit of U.S. Provisional Patent Application No. 63/060,944, filed on Aug. 4, 2020, the disclosure of which is incorporated by reference herein.

BACKGROUND OF THE INVENTION

The present invention relates generally to LEDs, and more particularly to LEDs in an optical communication system.

Lasers tend to dominate optical communications on account of their narrow linewidth, single spatial mode output, and high-speed characteristics. The narrow linewidth of a laser allows for passage of high speed signals through dispersive media for long distances without uncompensatable pulse broadening. Long distance fiber optic links are frequently limited by chromatic dispersion and thus a narrow linewidth laser may be essential for long distance fiber optic links. The single spatial mode of a laser is also relatively easy to couple to single mode fiber.

The stimulated emission of lasers may also allow for high modulation speeds. Directly modulated optical links using lasers may be able to run at 25 Gb/s, and potentially carrying 50 Gb/s of information using PAM4 modulation.

However, use of lasers may present difficulties for optical communications for very short distances, such as chip to chip communications.

BRIEF SUMMARY OF THE INVENTION

Some embodiments provide an LED for use in optical communications, the LED comprising: a p type layer; an n type layer; at least one quantum well layer and at least one barrier layer between the p type layer and the n type layer, at least one of the quantum well layer and the barrier layer doped with a dopant. In some embodiments the at least one of the quantum well layer and the barrier layer is doped with a n-type dopant. In some embodiments the n-type dopant comprises Magnesium. In some embodiments doping concentration of the Magnesium is in a $10^{18}/cm^3$ to $10^{20}/cm^3$ range. The at least one quantum well layer comprises at least two quantum well layers, with at least two quantum well layers separated by a one of the at least one barrier layer, and the one of the at least one barrier layer is doped with Silicon in a range of $10^{13}/cm^3$ to $10^{15}/cm^3$. In some embodiments the quantum well layer comprises InGaN and the barrier layer comprises GaN, and wherein an external tensile strain is applied parallel to a plane defined by an interface of the quantum well layer and the barrier layer, such that the applied strain reduces strain due to mismatch of the lattice of the InGaN of the quantum well layer and the GaN of the barrier layer. Some embodiments further comprise at least one interlayer, the interlayer being between at least one of the at least one quantum well layer and the at least one of the at least one barrier layer, the barrier layer comprises GaN, and the interlayer is under tensile strain with the GaN. In some embodiments the interlayer comprises AlGaN. In some or all of these embodiments the LED is a microLED.

Some embodiments provide an optical communication system for communicating information provided by a processor to another area of the processor or another chip in a multi-chip module, comprising: an LED associated with the processor; an LED driver to modulate optical output power of the LED, such that the LED will generate light based on data provided to the LED driver from the processor; a detector for performing optical-electrical conversion using the light; and an optical waveguide optically coupling light from the LED to the detector; wherein the LED comprises: a p type layer; an n type layer; at least one quantum well layer and at least one barrier layer between the p type layer and the n type layer, at least one of the quantum well layer and the barrier layer doped with a dopant.

In some embodiments the at least one of the quantum well layer and the barrier layer is doped with a n-type dopant. In some embodiments the n-type dopant comprises Magnesium. In some embodiments doping concentration of the Magnesium is in a $10^{18}/cm^3$ to $10^{20}/cm^3$ range. In some embodiments the at least one of the quantum well layer and the barrier layer is doped with a n-type dopant. In some embodiments the n-type dopant comprises Silicon. In some embodiments doping concentration of the Silicon is in a $10^{18}/cm^3$ to $10^{20}/cm^3$ range. In some embodiments the at least one quantum well layer comprises at least two quantum well layers, with at least two quantum well layers separated by a one of the at least one barrier layer, and the one of the at least one barrier layer is doped with Silicon in a range of $10^{13}/cm^2$ to $10^{15}/cm^2$.

In some embodiments the quantum well layer comprises InGaN and the barrier layer comprises GaN, and wherein an external tensile strain is applied parallel to a plane defined by an interface of the quantum well layer and the barrier layer, such that the applied strain reduces strain due to mismatch of the lattice of the InGaN of the quantum well layer and the GaN of the barrier layer. In some embodiments a width of the quantum well layer is in a range of 2 nm to 3 nm. In some embodiments a width of the quantum well layer is in a range of 3 nm to 4 nm.

Some embodiments further comprise at least one interlayer, the interlayer being between at least one of the at least one quantum well layer and the at least one of the at least one barrier layer, the barrier layer comprises GaN, and the interlayer is under tensile strain with the GaN. In some embodiments the interlayer comprises AlGaN.

In some embodiments the LED is a microLED.

Some embodiments further comprise: a further LED associated with the other area of the processor or other chip in the multi-chip module; a further LED driver to modulate optical output power of the further LED, such that the further LED will generate light based on data provided to the further LED driver from the other area of the processor or other chip in the multi-chip module; and a further detector for performing optical-electrical conversion using the light from the further LED; wherein the further LED comprises: a p type layer; an n type layer; and at least one quantum well layer and at least one barrier layer between the p type layer and the n type layer, at least one of the quantum well layer and the barrier layer doped with a dopant. In some embodiments the optical waveguide optically couples light from the further LED to the further detector.

These and other aspects of the invention are more fully comprehended upon review of this disclosure.

BRIEF DESCRIPTION OF THE FIGURES

2C shows an optimized doping structure for an LED, in accordance with aspects of the invention, and with FIG. 2D showing a band diagram for the device of FIG. 2C.

DETAILED DESCRIPTION

Figure 1:
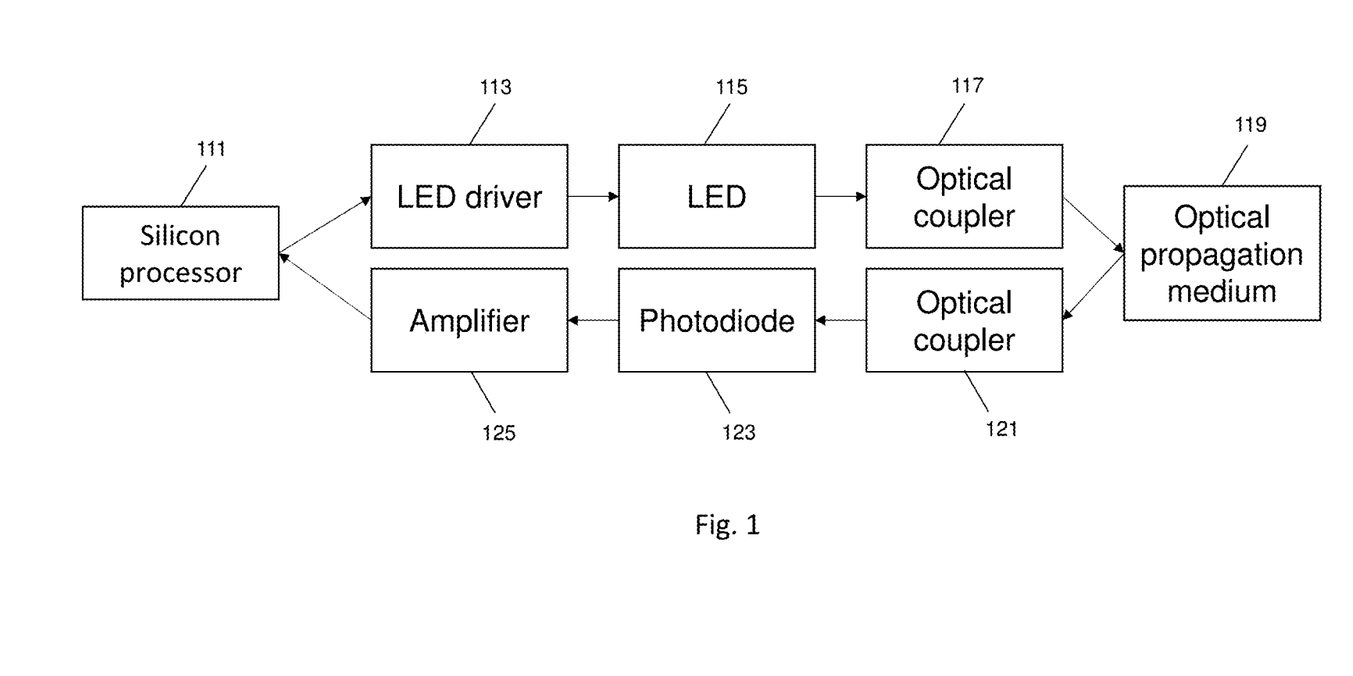
FIG. 1 is a block diagram showing an example of use of an LED in an optical communication system, in accordance with aspects of the invention.

FIG. 1 shows an example of use of an LED, which may be a microLED, in an optical communication system. In FIG. 1, a silicon processor 111 performs various operations on or with data. For example, the silicon processor may perform calculations on data, may perform switching functions, or may perform other functions. The silicon processor provides at least some of the data to an LED driver 113, with the LED driver activating the LED 115 to generate light, with the LED driver thereby modulating output optical power of the LED so as to optically provide the at least some of the data. The generated light is provided to an optical coupler 117, which passes the light into an optical propagation medium 119. The optical propagation medium, which may be for example a waveguide, may be used to transfer the light from one area of the silicon processor to another area of the silicon processor in some embodiments. In other embodiments, the optical propagation medium may be used to transfer light from the silicon processor to another silicon processor, or memory, or other chip, for example in a multi-chip module (not shown in FIG. 1) (with the term "chip" generally used interchangeably with "integrated circuit" or "IC," unless the context indicates otherwise). The optical propagation medium may transfer the light to another optical coupler 121, which in turn passes the light to a detector 123, for example a photodiode, for optical-electrical conversion. The electrical signal including the at least some of the data may be amplified by an amplifier 125, and provided to the silicon processor (or other chip in a multi-chip module). In some embodiments the LEDs and detectors can be coupled to waveguides individually, and/or in some embodiments they may be coupled in parallel as arrays. The optical waveguides, in addition to transferring the light and the data from one position to another could also split the light into two or more outputs, allowing data fanout. The optical waveguides or medium could also perform some switching directing the output from one receiver to another receiver. As a person skilled in the art would necessarily understand, the optical links may be duplex, so that when there are one or more links from a first to a second chip, there may also be one or more links from the second chip to the first chip.

In some embodiments the LED is a microLED. In some embodiments a microLED is distinguished from a semiconductor laser (SL) as follows: (1) a microLED does not have an optical resonator structure; (2) the optical output from a microLED is almost completely spontaneous emission, whereas the output from a SL is dominantly stimulated emission; (3) the optical output from a microLED is temporally and spatially incoherent, whereas the output from a SL has significant temporal and spatial coherence; (4) a microLED is designed to be driven down to a zero minimum current, whereas a SL is designed to be driven down to a minimum threshold current, which is typically at least 1 mA. In some embodiments a microLED is distinguished from a standard LED by (1) having an emitting region of less than 10 μm×10 μm; (2) frequently having positive and negative contacts on top and bottom surfaces, whereas a standard LED typically has both positive and negative contacts on a single surface; (3) typically being used in large arrays for display and interconnect applications.

In general, operating speed of a microLED is limited by the capacitance of the LED and the carrier recombination time (or diffusion capacitance). The capacitance forms an RC circuit with the drive output impedance and forces a roll-off at high frequencies. The carrier lifetime means that the LED takes time to turn off, as one has to wait for the minority injected carriers to recombine for the light emission to cease, even after the electrical pulse has ended. The capacitance in these types of applications is generally not important, as the device size is very small (typically a few femtoFarads), but the carrier lifetime may be important. One can apply a reverse bias to the diode and shape the pulse electrically to pull the carriers out, but structure of the microLED can also be modified to improve speed.

Generally the speed of a microLED increases with current level. There are three ways that carriers can recombine in LEDs. At low current levels, the recombination is mediated by traps (SRH recombination). At higher current densities these traps become saturated and the quantum efficiency of the LED improves, as radiative recombination dominates. This radiative recombination rate speeds up as the carrier density increases, increasing the radiative efficiency and reducing the carrier lifetime. Thus the harder (e.g. greater current densities) the microLEDs are driven, the faster they operate. At high current densities, nonlinear non-radiative mechanisms such as an Auger recombination rate further reduces carrier lifetime, but Auger recombination is a non-radiative process that reduces the radiative quantum efficiency. For a fast microLED with a small diameter to increase the current density at a given current, the traps are relatively unimportant as they are saturated, and the relative significance of nonlinear nonradiative recombination versus radiative recombination rate may determine the quantum efficiency of the microLED.

A typical LED structure comprises or consists of an p type region, an "active" region where carriers recombine and light is emitted, and a n type region. There are numerous different LED structures that differ in the structure of the active region. In some embodiments, the active region contains one or more quantum wells (QWs)

Figure 2A:
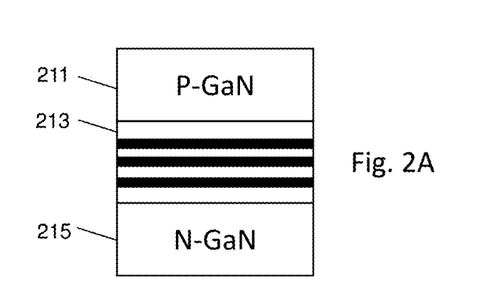
FIG. 2A shows a typical p-i-n LED structure.
Figure 2B:
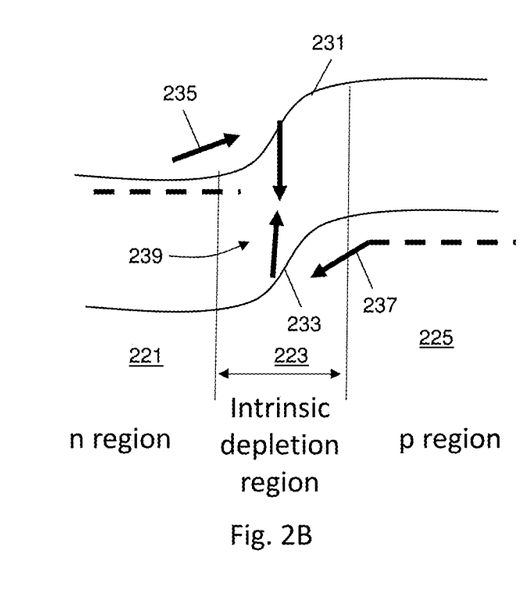
FIG. 2B shows a band diagram for the device of FIG. 2A, and FIG.
Figure 2C:
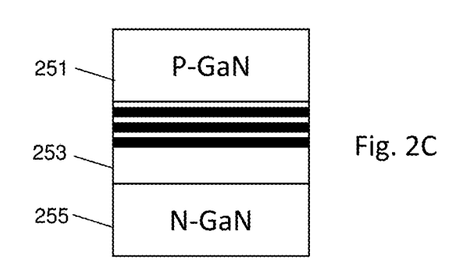
Figure 2D:
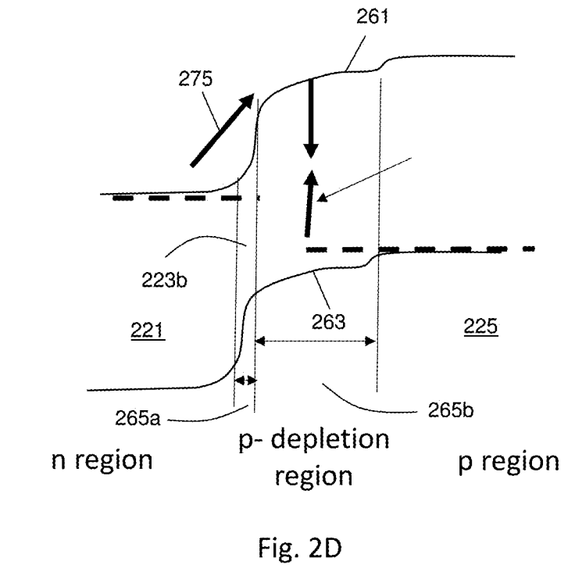

FIG. 2A shows a typical p-i-n LED structure and FIG. 2C shows an optimized doping structure, with FIGS. 2B and 2D also showing associated band diagrams for the devices of FIGS. 2A and 2C, respectively. The device of FIG. 2A has a p doped GaN layer 211 and an n doped GaN layer 215 sandwiching an intrinsic region 213 having InGaN quantum wells. The device of FIG. 2C also has a p doped GaN layer 251 and an n doped GaN layer 255 sandwiching an intermediate region. The intermediate region in the device of FIG. 2C, however, is doped p− type, and also contains InGaN quantum wells. In some embodiments the quantum wells are located physically closer to the p doped GaN layer than the n doped GaN layer.

The band diagram of FIG. 2B shows a conduction band 231 above a valence band 233, across an n region 221, an intrinsic/depletion region 223, and a p region 125. A bandgap between the conduction band and the valence band is generally constant across the regions, with energy levels generally increasing in the intrinsic/depletion region between the n and p regions, such that energy levels are higher in the p region than the n region. Electrons are injected 235 from the n region into the intrinsic/depletion region, holes are injected 237 from the p region into the intrinsic/depletion region, in which recombination 239 occurs.

The band diagram of FIG. 2D also shows a conduction band 261 above a valence band 263, across an n region 221, a depletion/p− region 265a,b, respectively, and a p region 225. Compared to the band diagram of FIG. 2B, it may be seen in FIG. 2D that the depletion/p− region replaces the intrinsic/depletion region, with the depletion region 265 adjacent the n region and the p− region 265b adjacent the p region 225. A bandgap between the conduction band and the valence band is generally constant across the regions, with energy levels generally increasing in the depletion/p− region, primarily in the depletion region, are higher in the p region 225 than the n region 221.

FIG. 2D, compared to FIG. 2B, also shows electron injection 275 over a much thinner depletion region into the p− region and the recombination is generally occurring there. In the GaN material system, the increase in background doping may decrease the radiative recombination time by at least an order of magnitude or a few orders of magnitude.

Though FIG. 2C shows a p, p−, n structure, one could also dope the quantum wells n type rather than p type. This also increases the speed the microLED compared to a p-i-n structure. The advantage of n doping versus p doping is that n doping does not increase defects and would not reduce radiative efficiency. The doping level can also be further increased to reduce the carrier recombination time at the price of a higher capacitance.

Some embodiments include further modifications to the doped structure of FIG. 2C that may further improve the performance. For example, some embodiments use an AlGaN barrier on the n region to further enhance injection of carriers into the p− doped recombination region and prevent hole injection into the n type region. Some embodiments optimize InGaN quantum wells in the p− region in terms of number, width, and strain to decrease recombination time. For example, a lower In concentration that pushes the wavelength to shorter wavelengths also increases the speed. Thus, microLEDs with wavelengths between 380 nm to 430 nm may be intrinsically faster than those at longer wavelengths. Fewer quantum wells also increase the carrier density in the quantum well for a given current. The carrier recombination time decreases faster as carrier density increases. So in some embodiments the microLED has only one or a few quantum wells. In some embodiments the quantum well width is also made smaller. A smaller quantum well width brings the electrons and holes closer together, with an increased overlap integral and reduced radiative recombination time. Some embodiments use an appropriate GaN substrate for growth to reduce the built-in electric field in the quantum wells, increasing the overlap integral between the electrons and holes and thus further reducing carrier recombination time. One can also reduce the built-in field by going to a smaller mole fraction of indium, once again getting faster response in the short wavelength range. A smaller indium concentration also lowers the Auger recombination rate, increasing the quantum efficiency of the LED.

In some embodiments the structure optimized for high speed operation has a small size, with a diameter of less than about two microns to increase the current density and the carrier density. In some embodiments the structure optimized for high speed operation has few quantum wells, perhaps only one, so that at a given current density the carrier density is maximized. In some embodiments the indium concentration of the quantum well is low, thus the microLED would emit at shorter wavelength, for example blue or ultraviolet wavelengths, as a smaller indium concentration would give a lower piezo-electric field that increases the hole-electron wavefunction overlap integral and thus increases recombination rate. In some embodiments the quantum well is small, typically 2 nm or less, to increase the overlap between electrons and holes. In some embodiments the quantum wells are doped either p type or n type to increase the background carrier density.

Figure 3A:
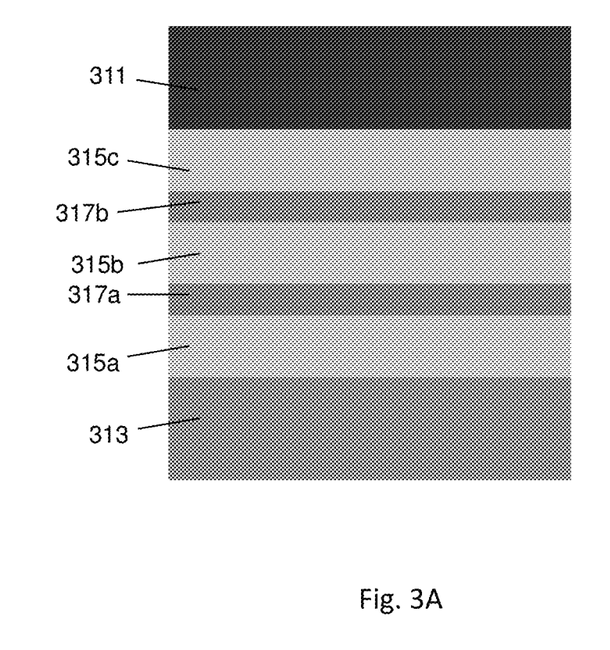
FIG. 3A shows a further embodiment of a microLED in accordance with aspects of the invention.

FIG. 3A shows a further embodiment of a microLED. The microLED of FIG. 3A includes a p-doped GAN top layer 311 and an n-doped GAN bottom layer 313. A multiple quantum well (MQW) stack or structure is between the p-doped top layer and the n-doped bottom layer. In the embodiment of FIG. 3A, the MQW stack includes a first GaN barrier layer 315a on top of the n-doped bottom layer, a first InGaN quantum well (QW) layer 317a on top of the first barrier layer, a second GaN barrier layer 315b on top of the first QW layer, a second InGaN QW layer 317b on top of the second barrier layer, and a third GaN barrier layer 315c on top of the second QW layer and under the p-doped top layer. In some embodiments only a single QW layer may be used, with only one barrier layer below the single QW layer, or with the single QW layer bracketed by barrier layers. In some embodiments more than two QW layers may be used, with barrier layers below or bracketing the QW layers.

In microLEDs, the active region where carriers recombine and light is generated typically comprises, and in some embodiments consists, of the multiple quantum well (MQW) structure. In the case of GaN microLEDs, the MQW stack typically comprises, and in some embodiments consists of, the stack of alternating GaN "barrier" layers and InGaN quantum well (QW) layers. Injected carriers "fall" into quantum wells (QWs), which serve as recombination regions. The doping in QWs and barriers is typically at a low density, which tends to minimize non-radiative recombination and maximize DC quantum efficiency.

In some embodiments, GaN/InGaN QWs and/or barriers are doped with p-type dopants. In some embodiments, GaN/InGaN QWs and/or barriers are doped with n-type dopants. These dopants can generate additional carriers, which increases the recombination rate. Because the QWs are generally narrow, the carrier wavefunctions extend significantly into the barriers outside of the QWs. Therefore, doping that enhances the radiative recombination rate can be introduced in the wells themselves or in the barriers.

If dopant levels are very high, they may lead to defects that increase non-radiative recombination rates (reflected by A, C1 and C2 coefficients in Eq. 1, below). Because increased non-radiative recombination rates increase modulation bandwidth, increasing non-radiative recombination may be acceptable or even desirable in some embodiments In some embodiments, GaN/InGaN QWs and or barriers are doped with magnesium (Mg), which acts as a p-type dopant. In further embodiments, the Mg doping concentration is in the $10^{18}/cm^3$ to $10^{20}/cm^3$ range.

In some embodiments, GaN/InGaN QWs are doped with silicon (Si), which acts as an n-type dopant. In further embodiments, the Si doping concentration is in the $10^{18}/cm^3$ to $10^{20}/cm^3$ range. In some embodiments, the barrier between QWs contains a thin layer that is highly doped with Si in the range of $10^{13}$-$10^{15}/cm^2$; this thin layer is sometimes referred to as a "delta-doped" layer.

In GaN, QWs are typically created by sandwiching a thin InGaN QW layer between two GaN "barrier" layers. The larger the fraction of In in the InGaN layer, the deeper the quantum well. InGaN QWs grown on GaN are compressively strained with respect to GaN, and increasing the Al fraction increases the crystal lattice mismatch between the InGaN and GaN. These materials display a built-in electric field associated with a strong piezoelectric effect due to their lack of crystal lattice inversion symmetry. A built-in electric field as high as 2.45 MV/cm is generated in an In0.2Ga0.8N/GaN quantum well due to the internal strain along the c-axis caused by the large GaN/InGaN lattice mismatch.

In InGaN/GaN QW LEDs, the radiative recombination rate is proportional to the square of the electron-hole spatial coupling strength, which is proportion to the overlap of the electron and hole wavefunctions. The built-in electric field associated with the piezoelectric effect reduces the overlap of the electron and hole wavefunctions, which reduces the recombination rate and thus reduces the microLED modulation bandwidth.

Figure 4:
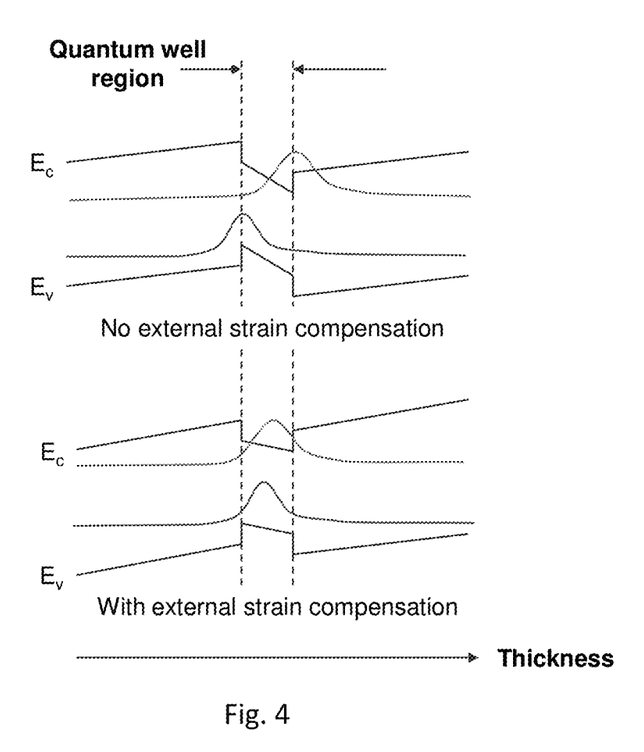
FIG. 4 shows energy bands and carrier wave functions with and without external strain compensation.

In some embodiments, an external tensile strain is applied parallel to the GaN/InGaN plane such that the applied strain reduces or cancels the strain due to the GaN/InGaN lattice mismatch. This reduces or eliminates the piezoelectric field due to this strain—as illustrated in the graphs of FIG. 4, showing energy bands and carrier wave functions with and without external strain compensation—which increases the electron-hole wavefunction overlap, the recombination rate, and the modulation bandwidth.

In some embodiments, the width of the QWs is in the range of 3 nm-4 nm. In some embodiments, the width of the QWs is in the 2 nm-3 nm range. The thinner QWs may improve the overlap between the hole and electron wavefunctions, increasing the recombination rate and thus increasing the modulation bandwidth of the microLEDs. However, carriers may more easily escape or skip over narrow QWs, reducing the quantum efficiency (QE). Thus, there is a trade-off between recombination rate and QE as the QWs are made thinner.

Figure 5:
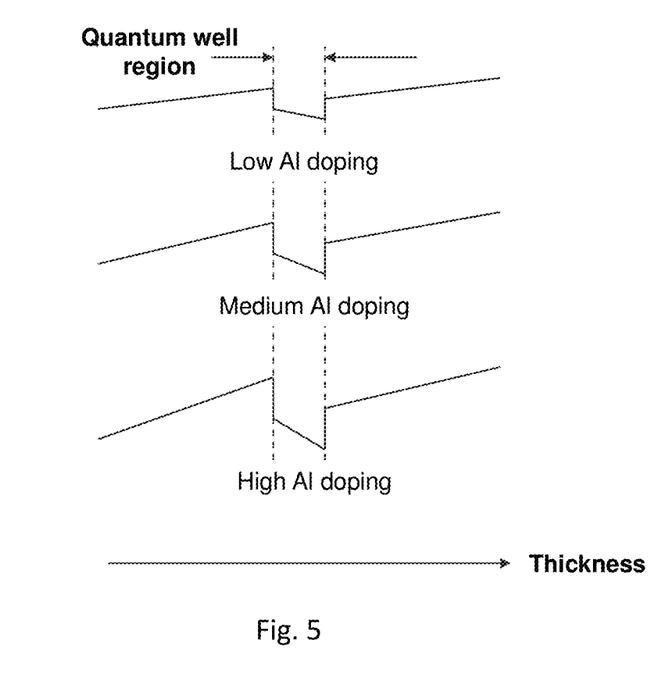
FIG. 5 shows energy bands with varying Al doping.

The QW depth, strain, and piezoelectric field increase as the Al fraction increases. Conversely, decreasing the Al fraction decreases the QW depth, strain, and piezoelectric field, which increases the radiative recombination rate, as may be seen in FIG. 5, showing energy bands with varying Al doping. Thus, it is desirable from the standpoint of radiative recombination rate and modulation bandwidth to decrease the Al fraction. However, if the QWs are too shallow, carriers within the well may "leak" out of the well, resulting in a reduction in carriers available to radiatively recombine in the QW region.

There is an optimum QW depth based on this trade-off of strain-induced recombination rate reduction and leakage current from thermally-excited carriers. In some embodiments, the In percentage in the QWs is such that the depth of the QWs is within the range of kT to 5 kT, where k is Botzmann's constant and T is the absolute temperature in Kelvin.

Figure 3B:
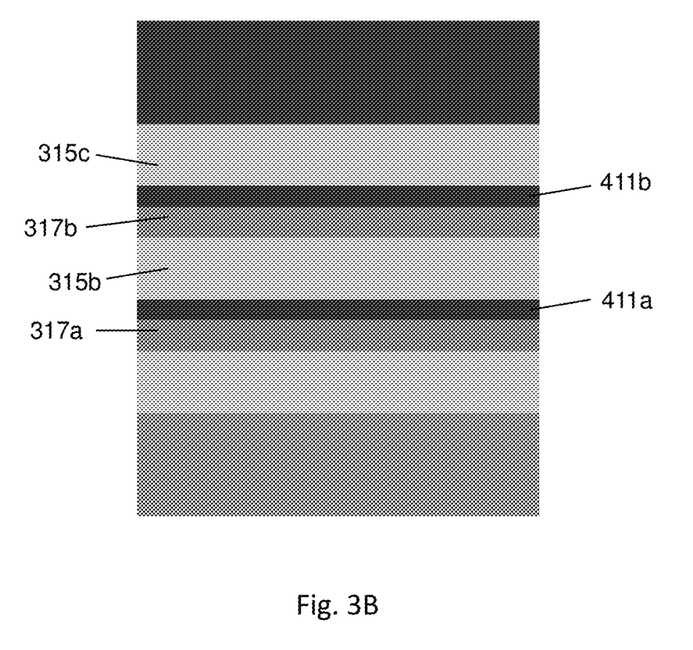
FIG. 3B shows yet a further embodiment of a microLED in accordance with aspects of the invention.

FIG. 3B shows yet a further embodiment of a microLED. The embodiment of FIG. 3B is the same as the embodiment of FIG. 3A, except that the embodiment of FIG. 3B includes interlayers (IL) in the MQW stack. Two interlayers are illustrated in FIG. 3B, with a first interlayer 411a between the first QW layer 317a and the second barrier layer 315b, and a second interlayer 411b between the second QW layer 317b and the third barrier layer 315c.

In some embodiments the IL is under tensile strain with GaN, which compensates some or all of the compressive strain from the InGaN/GaN lattice mismatch. In some embodiments, the piezoelectric effect from the IL cancels some or all of the piezoelectric field due to the InGaN/GaN lattice mismatch, and reduces the built-in electrostatic charges at the layer interfaces. As a consequence, the potential well in the InGaN layer tends to the flat-band condition and the electron-hole wavefunction overlap is maximized, increasing the radiative recombination rate.

In some embodiments, the IL is made from AlGaN to create an $In_xGa_{1-x}N/Al_yGa_{1-y}N/GaN$ structure. In some embodiments, the thickness of the AlGaN IL is in the range of 0-3 nm. An AlGaN IL is under tensile strain with a neighboring GaN layer while an InGaN layer is under compressive strain with a neighboring GaN layer. Thus, an AlGaN layer placed next to an InGaN layer can compensate the InGaN/GaN lattice mismatch strain. The AlGaN IL may reduce out-diffusion of indium from the QWs and enable higher temperature growth of the GaN barriers, which anneals the QW and the ILs, improves the material quality, and reduces impurity incorporation.

The rate equation of the injected carriers in the active region of a microLED can be described by the equation:

$$dN/dt = AN + BN(N+p) + C_1N(p+N)^2 + C_2N^2(p+N) \quad (1)$$

where N is the injected carrier density (carriers per unit volume), p is the carrier density in the active region, A is the Shockley-Read-Hall (SRH) recombination coefficient, B is the radiative recombination coefficient, and $C_1$ and $C_2$ are the two Auger recombination coefficients. A, $C_1$ and $C_2$ reflect non-radiative recombination mechanisms while B is radiative.

Figure 6:
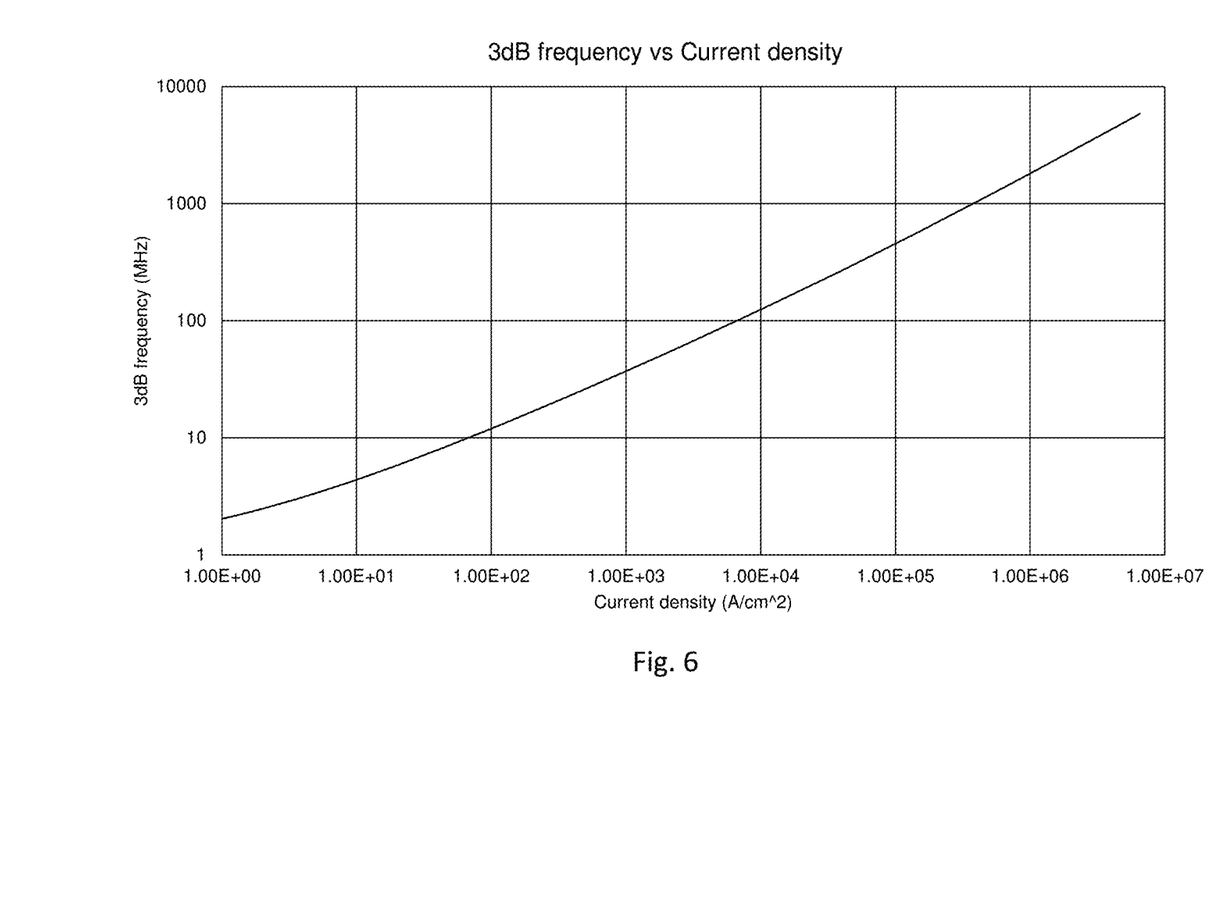
FIG. 6 is a graph of modulation frequency vs. current density.

The current density J is related to the rate of change of the carrier density by $$J = e\, d_{eff}\, dN/dt \quad (2)$$

Where e is the electron charge and $d_{eff}$ is the effective thickness of the recombination region. Combining Eq. (1) and Eq. (2) enables the computation of the modulation frequency vs J, for example as shown in FIG. 6.

The internal quantum efficiency (IQE) of the microLED is given by:

$$IQE = BN(N+p)/[AN + BN(N+p) + C_1N(p+N)^2 + C_2N^2(p+N)] \quad (3)$$

Figure 7:
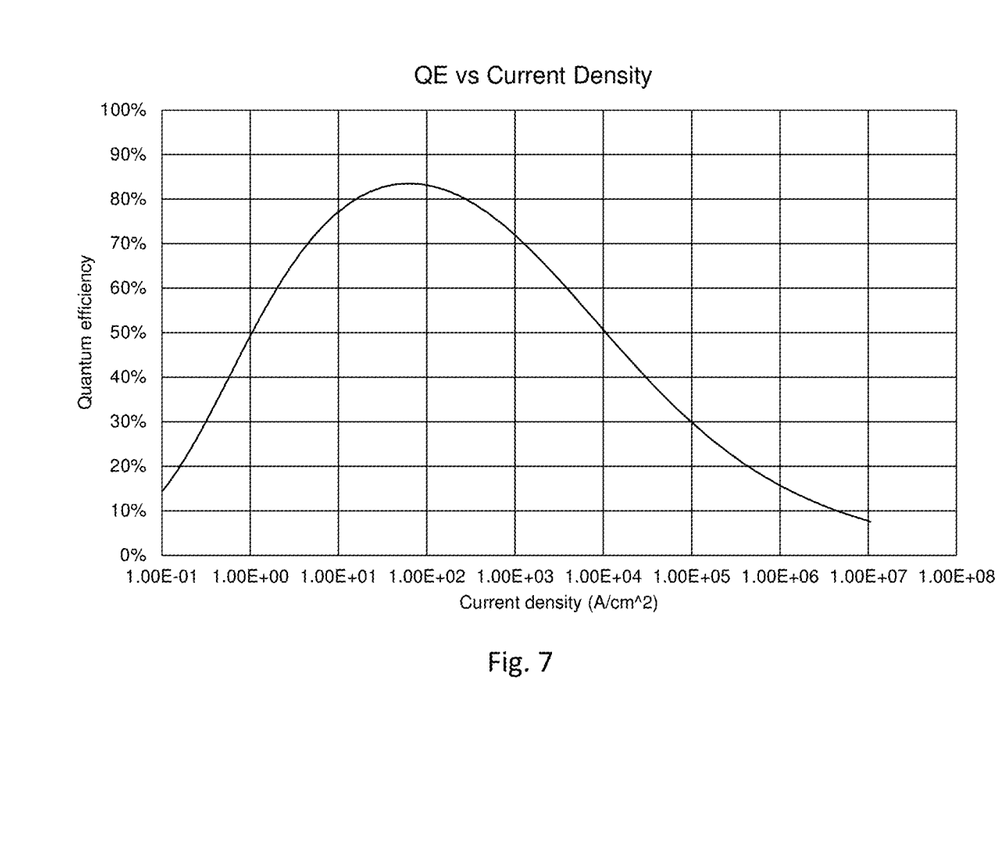
FIG. 7 is a graph of internal quantum efficiency vs. current density.

Combining Eq. (2) and Eq. (3) allows the computation of IQE vs J, for example as shown in FIG. 7. There is a current density at which QE is maximized. This typically occurs at <10 A/cm² in high-quality LEDs used for lighting or display applications.

The speed and quantum efficiency of microLEDs is maximized by maximizing the value of the B coefficient in Eq. (1) and Eq. (3). The value of B is increased by maximizing the overlap of the hole and electron wavefunctions. Several of the embodiments described herein focus on maximizing this overlap.

Figure 8:
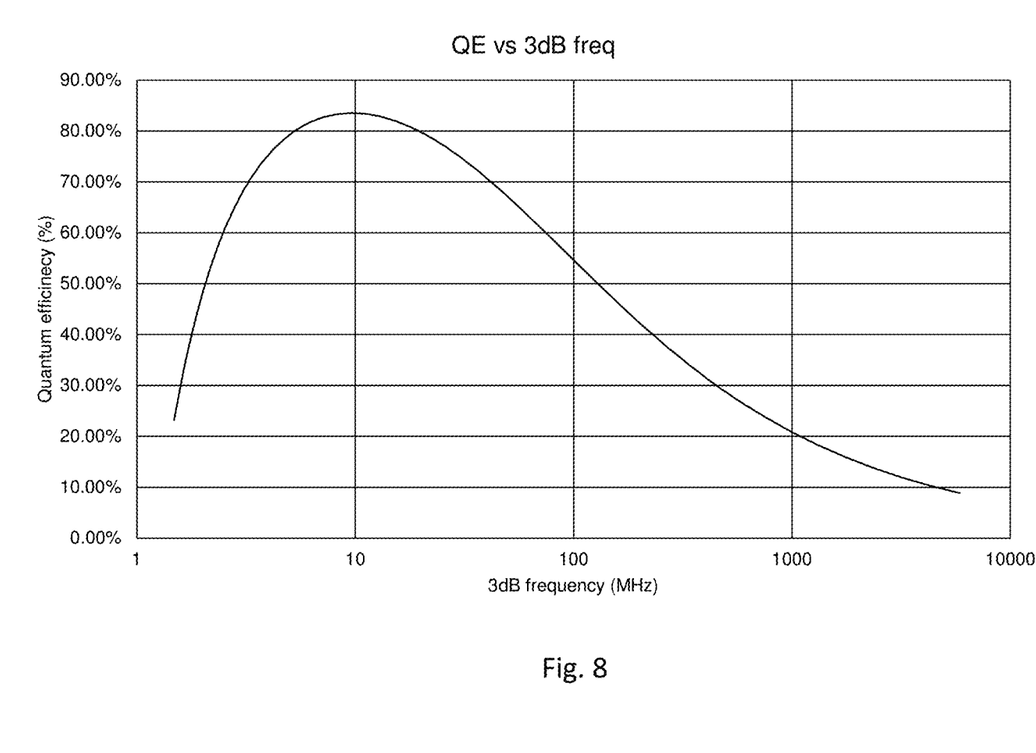
FIG. 8 a graph of a microLED time constant vs. drive current density.

FIG. 8 shows the microLED time constant vs drive current density. To be used for high-speed inter-chip communications, the microLED must be driven at sufficiently high current density to achieve the required modulation bandwidth. In some embodiments, the microLED is driven with a current density such that the modulation bandwidth of the microLED is between half the bit rate and the bit rate.

In some embodiments, the microLED is driven at a sufficiently high current density that Auger recombination causes a significant reduction in the carrier lifetime. In some embodiments, the high-frequency components of the drive signal are emphasized relative to the low frequency components, and the microLED to be operated at a current density where its modulation bandwidth is less than half the bit rate.

Figure 10:
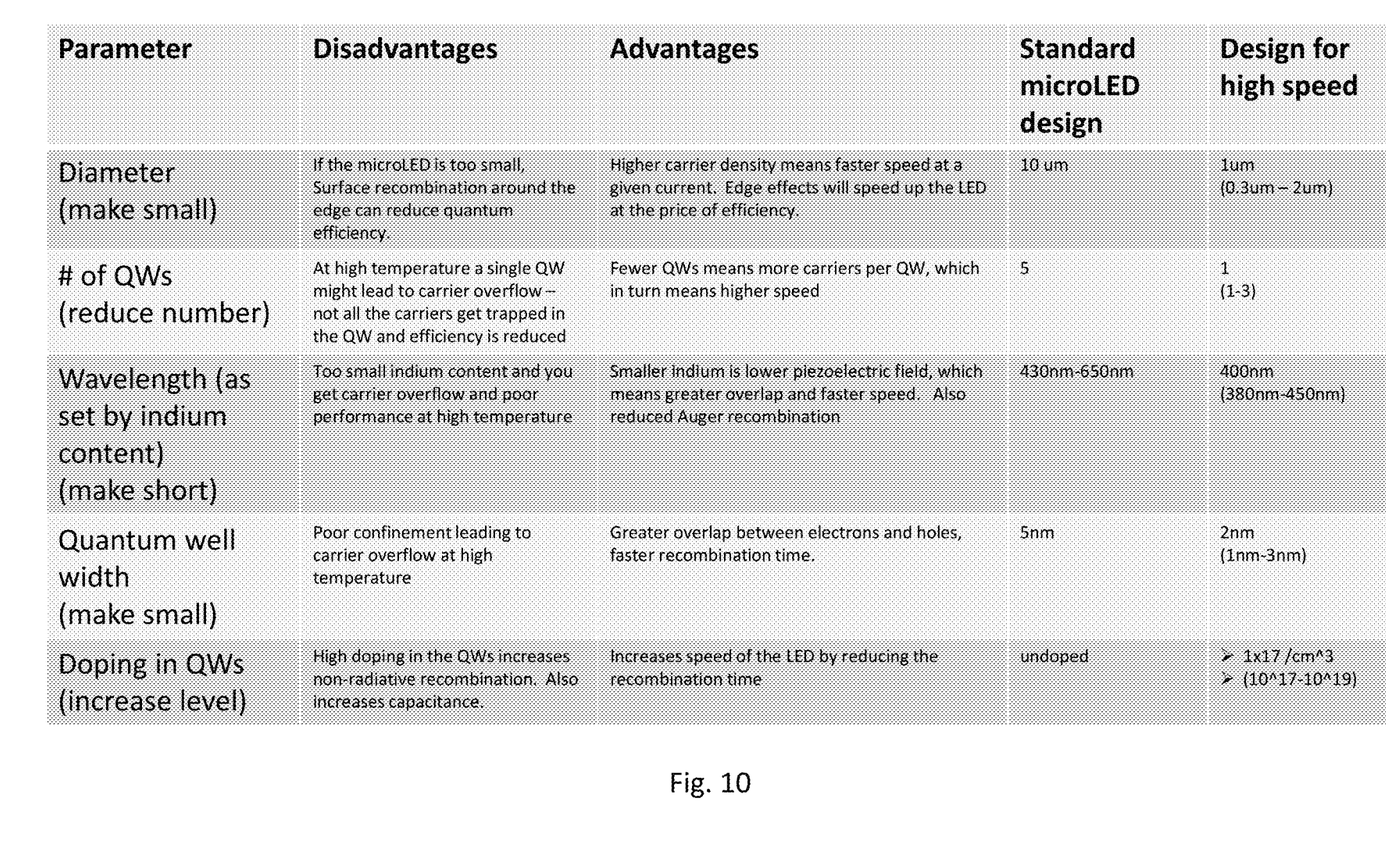
FIG. 10 is a table describing various trade-offs in the design of a microLED with typical parameters.

The table of FIG. 10 describes various trade-offs in the design of the microLED with typical parameters.

In general the higher doping also decreases the non-radiative recombination time. This further shortens the carrier lifetime and increases the speed, but with a penalty of reduced quantum efficiency. Once again, in these very short distance applications where there is little waveguide propagation loss, quantum efficiency may not be as important. Fundamentally, there is a trade-off between quantum efficiency and speed when the LED response is limited by the radiative recombination time at speeds where the LED response is limited by the radiative lifetime. Accordingly, in some embodiments the speed an LED is increased, dramatically in some embodiments, at the price of a lower brightness.

Fast recombination centers can be induced in the LED by a number of processes. These include a lower temperature growth of the crystal in the intrinsic region, proton implantation, deliberately induced defect density using dislocations in the crystal lattice, or even roughening the etched surface or having a larger exposed surface.

Figure 9:
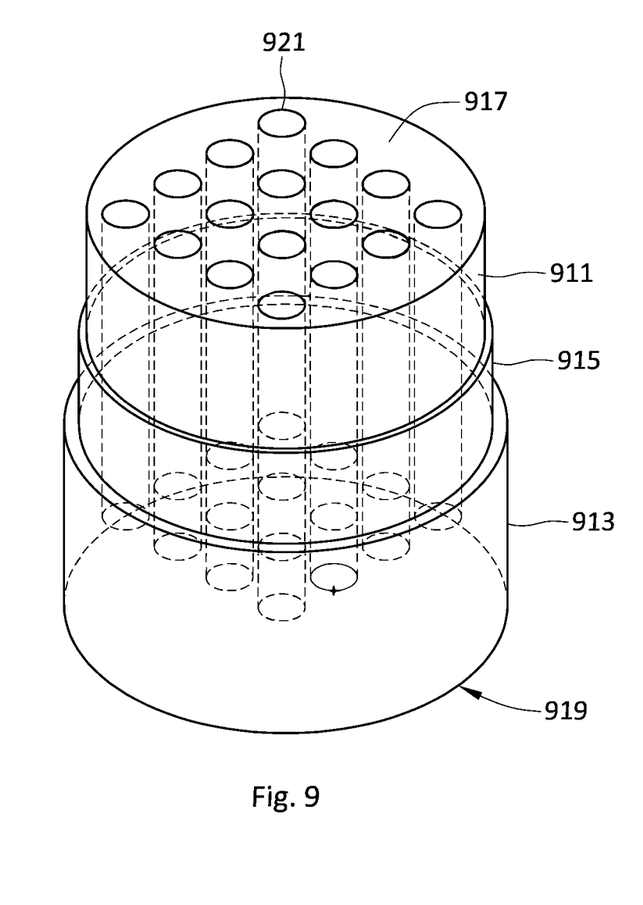
FIG. 9 shows a microLED with etched vias, in accordance with aspects of the invention.

Generally, smaller microLEDs tend to have lower quantum efficiencies because carriers diffuse and recombine at the etched surface. This reduces the carrier lifetime, and therefore also increases the speed of the microLED. This effect can be increased by etching holes in the structure that expose sidewalls and recombination centers. FIG. 9 shows a microLED with etched holes. The example of FIG. 9 shows a microLED with a generally cylindrical shape, extending between a circular base 919 to a circular top 917. The microLED may include a base layer 913 (which may be, e.g., an n GaN layer) extending upward from the circular base and a top layer 911 (which may be, e.g., a p GaN layer) extending downward from the circular top. A middle layer 915 is between the base layer and the top layer, and the middle layer may provide, as one would understand, an intrinsic depletion region or a p– depletion region.

The microLED of FIG. 9 also includes etched holes, for example etched hole 921, extending from the circular top to the circular bottom. The etched holes therefore provide apertures through the microLED, from the top surface to the bottom surface. In FIG. 9, the etched holes are of circular cross-section, thereby forming a cylindrical hole, with the holes generally arranged in a square or diamond pattern. The etched holes may induce non-radiative recombination at the exposed surface to reduce the carrier lifetime and therefore increase the speed. This may provide a more controllable method than proton implant or lower temperature growth. In this case when the device is etched to form the microLED, various structures can be used to increase the surface area. These include etching multiple pillars in some embodiments, and/or etched holes, as the figure shows. Other shapes such as stars or roughened edges may also or instead be used in some embodiments.

Although the invention has been discussed with respect to various embodiments, it should be recognized that the invention comprises the novel and non-obvious claims supported by this disclosure.

The invention claimed is:

1. An optical communication system for communicating information provided by a processor to another area of the processor or another chip in a multi-chip module, comprising:
   a microLED associated with the processor, said microLED having a diameter size less than 10 micrometers;
   a microLED driver to modulate optical output power of the microLED, such that the microLED will generate light based on data provided to the microLED driver from the processor;
   a detector for performing optical-electrical conversion using the light; and
   an optical waveguide optically coupling light from the microLED to the detector;
   wherein the microLED comprises:
      a p type layer;
      an n type layer; and
      at least one quantum well layer and at least one barrier layer between the p type layer and the n type layer, at least one of the quantum well layer and the barrier layer doped with a magnesium dopant and having a doping concentration in a $10^{18}/cm^3$ to $10^{20}/cm^3$ range, with quantum wells of the at least one quantum well layer located physically closer to the p type layer than the n type layer.

2. The system of claim 1, wherein the quantum well layer comprises InGaN and the barrier layer comprises GaN, and wherein an external tensile strain is applied parallel to a plane defined by an interface of the quantum well layer and the barrier layer, such that the applied strain reduces strain due to mismatch of the lattice of the InGaN of the quantum well layer and the GaN of the barrier layer.

3. The system of claim 2, wherein a width of the quantum well layer is in a range of 2 nm to 3 nm.

4. The system of claim 2, wherein a width of the quantum well layer is in a range of 3 nm to 4 nm.

5. The system of claim 1, further comprising at least one interlayer, the interlayer being between at least one of the at least one quantum well layer and the at least one of the at least one barrier layer, the barrier layer comprises GaN, and the interlayer is under tensile strain with the GaN.

6. The system of claim 5, wherein the interlayer comprises AlGaN.

7. The system of claim 1, further comprising:
   a further microLED associated with the other area of the processor or the other chip in the multi-chip module, said further microLED having a further diameter size less than 10 micrometers;
   a further microLED driver to modulate optical output power of the further microLED, such that the further microLED will generate light based on data provided to the further microLED driver from the other area of the processor or other chip in the multi-chip module; and
   a further detector for performing optical-electrical conversion using the light from the further microLED;

wherein the further microLED comprises:
  a p type layer;
  an n type layer;
  at least one quantum well layer and at least one barrier layer between the p type layer and the n type layer, at least one of the quantum well layer and the barrier layer doped with a magnesium dopant and having a doping concentration in a $10^{18}/cm^3$ to $10^{20}/cm^3$ range.

8. The system of claim 7, wherein the optical waveguide optically couples light from the further microLED to the further detector.

* * * * *